United States Patent [19]

Frisch et al.

[11] Patent Number: 4,594,311
[45] Date of Patent: Jun. 10, 1986

[54] PROCESS FOR THE PHOTOSELECTIVE METALLIZATION ON NON-CONDUCTIVE PLASTIC BASE MATERIALS

[75] Inventors: David C. Frisch, Baldwin; Wilhelm Weber, Hicksville, both of N.Y.

[73] Assignee: Kollmorgen Technologies Corporation, Dallas, Tex.

[21] Appl. No.: 665,952

[22] Filed: Oct. 29, 1984

[51] Int. Cl.⁴ .............................................. G03C 5/00
[52] U.S. Cl. .................................... 430/315; 430/323; 430/325; 430/326; 430/330; 430/331; 427/78; 427/336
[58] Field of Search ............... 430/315, 319, 330, 323, 430/325, 326, 331; 427/98, 306, 307, 336

[56] References Cited

U.S. PATENT DOCUMENTS

| | | |
|---|---|---|
| 3,562,005 | 2/1971 | DeAngelo et al. |
| 3,674,485 | 7/1972 | Jonker et al. |
| 3,772,078 | 11/1973 | Polichette et al. ................ 116/212 |
| 3,930,963 | 1/1976 | Polichette et al. ................ 204/15 |
| 3,959,547 | 5/1976 | Polichette et al. ................ 428/209 |
| 3,994,727 | 11/1976 | Polichette et al. |
| 4,084,023 | 4/1978 | Dafter ................................ 427/98 |
| 4,085,285 | 4/1978 | Lippits et al. ..................... 174/68.5 |
| 4,098,922 | 7/1978 | Dinella et al. .................... 427/54 |
| 4,133,908 | 1/1979 | Madsen ............................. 427/53 |
| 4,167,601 | 9/1979 | Beckenbaugh et al. ........... 428/209 |
| 4,262,085 | 4/1981 | Ehrich et al. ..................... 430/317 |
| 4,268,536 | 5/1981 | Beckenbaugh et al. ........... 427/54.1 |
| 4,281,034 | 7/1981 | Narayan ............................ 427/191 |
| 4,388,351 | 6/1983 | Sawyer .............................. 427/304 |
| 4,424,095 | 1/1984 | Frisch et al. ..................... 156/629 |
| 4,451,505 | 5/1984 | Jans .................................. 427/98 |
| 4,537,799 | 8/1985 | Dorey, II et al. ................. 427/259 |

OTHER PUBLICATIONS

Mansveld and Jans, *Plating and Surface Finishing*, vol. 66, p. 14 (Jan. 1979).
Resin Lexan ®-*Technifact Bulletin* (11/82) by General Electric Company, One Plastics Avenue, Pittsfield, Mass. 01201.

Primary Examiner—John E. Kittle
Assistant Examiner—José G. Dees
Attorney, Agent, or Firm—Morgan, Finnegan, Pine, Foley & Lee

[57] ABSTRACT

Catalytically imaged thermosetting and thermoplastic resin objects including printed circuit boards are provided. A hydrophilic, adhesion promoted insulating base material is treated in selected areas to produce metallic nuclei in the form of an image of a desired metal pattern. The image is exposed to an electroless metal bath to reinforce the image. Then, the non-imaged areas of the base are rendered hydrophobic by means of solvent treatment. The imaged areas are built up by metal deposition. Preferably, the solvent treatment of the non-imaged areas of the base material is repeated to enhance adhesion of the metal pattern to the base material.

45 Claims, 10 Drawing Figures

PROCESS FOR THE PHOTOSELECTIVE METALLIZATION ON NON-CONDUCTIVE PLASTIC BASE MATERIALS

BACKGROUND OF THE INVENTION

1. Field of the Invention

This invention relates to photoselective metallization of non-conductive plastic base materials. More specifically, it relates to the manufacture of additive printed circuits by electrolessly plating catalytic images on adhesion promoted surfaces of insulating base materials.

2. Description of the Prior Art

In "resist imaging" fully additive processes which are commonly employed today for producing printed circuits on resinous insulating base materials, a conductor pattern is formed by electrolessly plating metal on an adhesion promoted surface of the resinous insulating base material. A plating resist is applied before or after adhesion promotion, onto the background, which is the area free of electrolessly deposited conductors on the printed circuit board. In order to obtain an adhesion promoted surface, the surface of the insulating base material is rendered microporous and hydrophilic. This may be accomplished by plasma or by mechanical means, but is usually achieved by a strong acid or oxidizing solution, or by swelling the surface with a solvent, and then subjecting the pretreated surface to a strong oxidizing agent such as chromic acid. The background is hydrophobic during electroless plating because the surface of the plating resist is hydrophobic.

In "resistless imaging" additive processes, a conductive pattern image, catalytic for electroless deposition, is formed on the adhesion promoted and thus hydrophilic, surface of an insulating base material. Fully additive resistless imaging processes have a hydrophilic background during electroless plating. The presence of a hydrophilic background surface during metal plating renders such background susceptible to extraneous metal plating, which is undesirable. Unlike resist imaging, fully additive processes, which rely upon hydrophobic resist masking layers, resistless systems rely instead on heavily stabilized plating baths and/or periodic "quick etching" during the plating cycle to minimize adherence of extraneous metal deposits.

De Angelo et al., in U.S. Pat. No. 3,562,005 describe a resistless imaging process wherein an adhesion promoted surface is treated with stannous chloride. A conductor image is produced by exposing the surface to hard ultra-violet radiation through a photographic positive of the desired circuit pattern. The exposure converts the stannous moiety between the conductors to a stannic species. Subsequently, the surface is treated with palladium chloride and only the stannous moiety remaining in the conductive pattern reacts with the palladium chloride to form an image catalytic for electroless metal deposition. This process, while capable of reproducing conductor images of very fine detail, never was used in production by Western Electric Co., Inc., the assignee of De Angelo et al. because of defects caused by extraneous metal deposition.

Mansveld and Jans, Plating and Surface Finishing, Vol. 66, page 14 (Jan. 1979); Jonker et al., U.S. Pat. No. 3,674,485; Jans, U.S. Pat. No. 4,451,505; and Lippits et al., U.S. Pat. No. 4,085,285 describe production of a resistless image by illuminating a titanium dioxide coated or filled surface through a photographic negative of the desired pattern to impart a surface charge. The surface charge, in a positive pattern, is treated with a palladium containing solution to provide in the charged areas a resistless image catalytic for electroless metal deposition. Despite substantial investment by the owner of this technology, N.V. Philips Gloeilampenfabrieken ("Philips"), including a full scale manufacturing facility, Philips was unable to resolve the problems related to extraneous metal deposition and this process did not find acceptance as a production method.

Polichette et al. in U.S. Pat. Nos. 3,772,078; 3,930,963; 3,959,547; and 3,994,727, teach a resistless imaging process for producing printed circuits wherein a real image is produced on a surface of an insulating base material which has been treated with a solvent such as dimethylformamide and with chromic acid and/or sulfuric acid to adhesion promote the surface. The adhesion promoted surface is treated with a solution containing copper salts, 2,6-anthraquinone disulfonic acid and a polyol. The treated surface is dried and then exposed to printing light through a photographic negative to produce a real image of copper nuclei which are catalytic for electroless copper plating. The anthraquinone disulfonic acid and unexposed copper salts are removed from the surface by washing. In practice, this process also had extraneous copper deposition, both "flare" (a plume shaped deposit of extraneous copper particles growing above a conductor on the insulating surface of the base material placed vertically in an electroless plating solution) as well as general random formation of extraneous metal deposits in areas between the conductive patterns.

Dafter, U.S. Pat. No. 4,084,023; Dinella et al., U.S. Pat. No. 4,098,922; Madsen, U.S. Pat. No. 4,133,908; Beckenbaugh et al., U.S. Pat. No. 4,167,601; and Beckenbaugh et al., U.S. Pat. No. 4,268,536, all assigned to Western Electric, Inc. ("Western Electric"), describe methods of improving the "contrast" and providing "anti-fogging" in the processes of Polichette et al. Poor contrast and fogging are synonymous with the formation of extraneous metal deposits. Among the aforementioned methods are pre-dips in alkaline chelating solutions and organic acid solutions to improve removal of anthraquinone disulfonic acid and unexposed copper salts; and the use of special electroless plating bath stabilizers to reduce extraneous metal deposition by the plating solution. This process necessitated tight control to prevent extraneous metal deposition.

Ehrich et al., in U.S. Pat. No. 4,262,085, describe another improvement to the process of Polichette et al. directed to the elimination of extraneous metal deposition. After forming a conductor image of copper nuclei, on a surface of a base material, Ehrich et al. exchange the copper nuclei with palladium, rinse, deposit a thin coating of electroless nickel and then electrolessly deposit a copper conductive pattern from a solution stabilized with potassium selenocyanate. Although the Ehrich et al. method was reported to have achieved successful results in pilot plant operation, it was found on a production scale to be unreliable with a tendency not to produce a complete image of the conductive pattern and not to produce freedom from extraneous metal deposits.

The need for a reliable resistless imaging process suitable for the manufacture of printed circuit boards has existed for almost two decades. The substantial efforts in the past around the world by major electronic and chemical companies to develop this process have been unsuccessful. "Vapor Polishing" with methylene chloride has been used to remove scratches from thermoplastics such as polycarbonate, leaving a smooth, glossy finish, e.g., See Resin Lexan ®[R] Technifact Bulletin (11/82) by General Electric Company, One Plastics Avenue, Pittsfield, Mass. 01201. Vapor polishing also has been used to restore semi-additive printed circuits on polysulfone based material to a transparent state.

SUMMARY OF THE INVENTION

1. Objects of the Invention

An object of this invention is the formation of metal patterns on polymeric substrates by resistless imaging techniques without extraneous metal deposition.

An object of this invention is to provide a process for forming printed circuits by resistless imaging and electroless plating without extraneous metal deposition.

It is an object of this invention to render hydrophobic a hydrophilic background surface of a resinous insulating base material.

Another object is to provide a process for eliminating micropores present on the surface of an adhesion promoted thermoplastic substrate in areas not corresponding to the pattern to be formed by metal deposition, subsequent to formation of a reinforced image of the pattern on the surface by a metal plating step.

An object of the invention is to provide a process for rendering hydrophobic an etched hydrophilic polymeric surface in areas which do not correspond to a desired metal pattern after establishing a metal image of the pattern or an image of the pattern which is catalytic for metal plating, on a portion of the polymer surface.

An object of this invention is to provide a process for eliminating micropores in the background (the areas between areas corresponding to the desired conductor pattern) of fully additively plated printed circuits whose substrates comprise a high temperature thermoplastic polymer, in order to prevent indiscriminate metal deposition and to enhance surface electrical properties as well as aesthetic qualities of the printed circuit board.

It also is an object of this invention to provide a process for rendering hydrophobic an etched hydrophilic surface of a thermosetting resin polymeric material after establishing a metal image or an image which is catalytic for metal plating on a portion of the surface of the polymeric material.

An object of this invention is to provide an improved process for manufacturing a metal core circuit board.

Another object is to provide an improved process for producing conductor patterns on three-dimensional polymer articles.

An object of this invention is to provide a process for forming metal patterns without extraneous metal deposition on thermoplastic articles having heat distortion temperatures below 170° C.

An object of this invention is to provide an improved process for manufacturing printed wiring boards, including single-sided, double-sided and multilayer boards having high surface resistance and excellent bond strength between the surface of the insulating base material and the electrolessly deposited metal adhered thereto, good stability at soldering temperatures and reproducible and economical methods of manufacture.

Additional objects and advantages of the invention will be set forth in the description or may be realized by practice of the invention, the objects and advantages being realized and attained by means of the methods, processes, instrumentalities and combinations particularly pointed out in the appended claims.

2. Definitions

By the term "aromatic polyether polymer" is meant a thermoplastic polymer characterized by recurring aromatic and ether units in the polymer chain. Representative, but not limiting examples, include sulfone polymers, polyetherimides and polyetherketones.

By "sulfone polymer" is meant a thermoplastic polymer containing the sulfone group $O=S=O$, including the following polymers: polysulfone, polyethersulfone, polyarylsulfone and polyphenylsulfone.

By the term "high temperature thermoplastic polymer" is meant a polymer having an aromatic backbone that does not liquify or decompose at a temperature of about 245° C. after 5 seconds exposure at such a temperature. The polymer has a heat deflection temperature of 170° C.

By "solvate" is meant the adsorption of a surface layer of solvent by a polymer, and may be accompanied by swelling of the polymer surface.

Other terms such as "additive", "adhesion promotion", "base material", "extraneous copper", "printed circuit", "printed circuit board", and "resin rich" are used as defined in ANSI/IPC-T-50B, *Terms and Definitions for Interconnection and Packaging Electronic Circuits* (June 1980), incorporated herein by reference.

3. Brief Description of the Invention

This invention provides a process for restoring hydrophobicity to and smoothing the exposed surface of an adhesion promoted resinous surface of a base material after a catalytic resistless image has been imposed thereon. The base material may be comprised of a resin-rich, epoxy impregnated, glass cloth laminate, a resin coated metal core base material; a thermoplastic or thermoset polymer; or a thermoset laminate clad with a high temperature thermoplastic polymer. The surface of the base material has been treated to render it microporous and hydrophilic, thus suitable for securely adhering electrolessly formed metal deposits. It has been found that hydrophobicity and a smooth surface can be restored to the treated resinous surface by exposing it to a solvent or solvent vapors in which the resin surface region may be solubilized for a time period sufficient to solvate the surface region but insufficient to result in stress cracking or flow of the resinous surface onto the metal pattern plated on the surface, and thereafter immediately drying the polymer at a temperature at which the solvent rapidly volatilizes to restore hydrophobicity of the surface and also to prevent flow of the resinous surface onto the metal pattern.

DETAILED DESCRIPTION OF THE INVENTION

Figure 1:
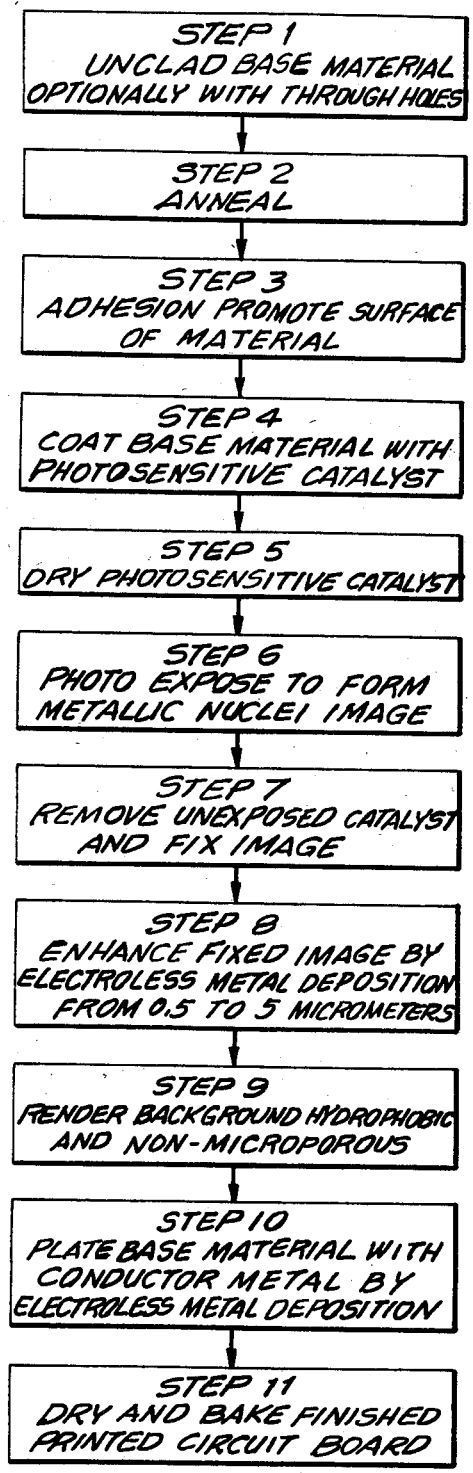
FIG. 1 is a schematic flowchart which illustrates a process for producing a printed circuit on a polymeric base material according to the present invention.
Figure 2A:
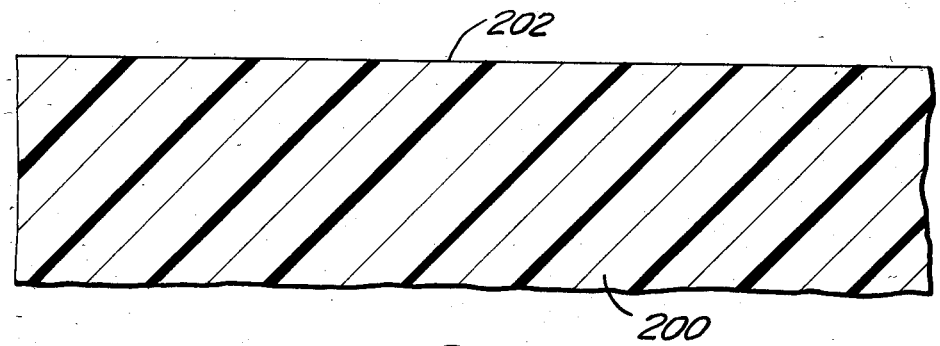
FIG 2A through 2I are side view in cross section of a surface region of the polymer base material showing the surface region at stages in the formation of a printed circuit according to the process of this invention.
Figure 2B:
Figure 2C:
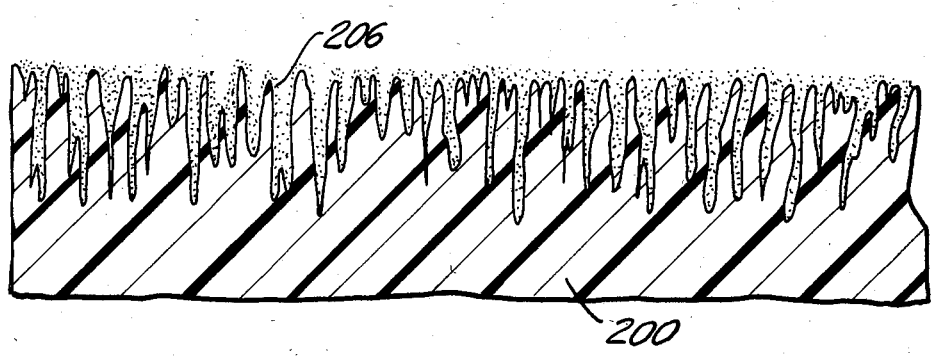
Figure 2D:
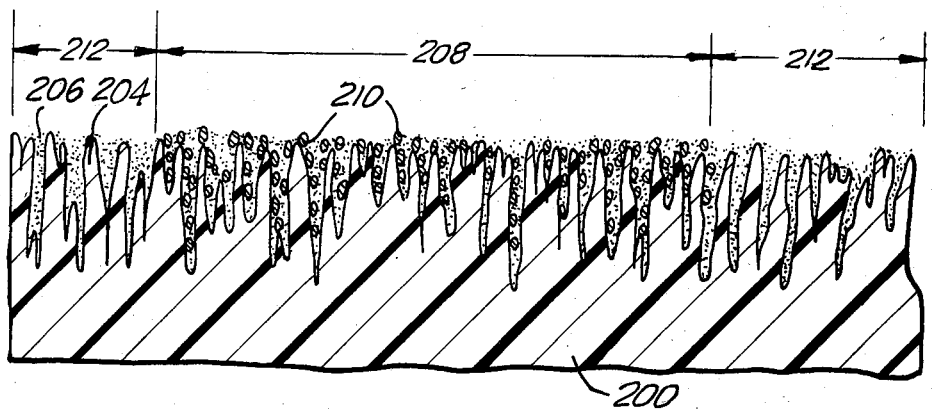
Figure 2E:
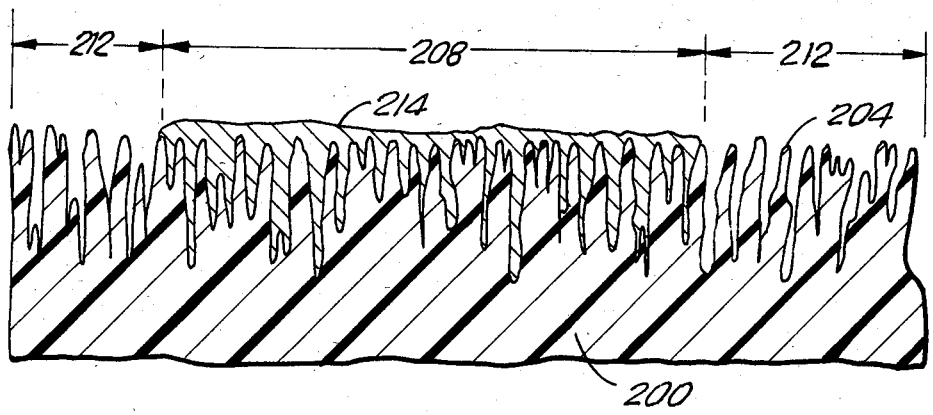
Figure 2F:
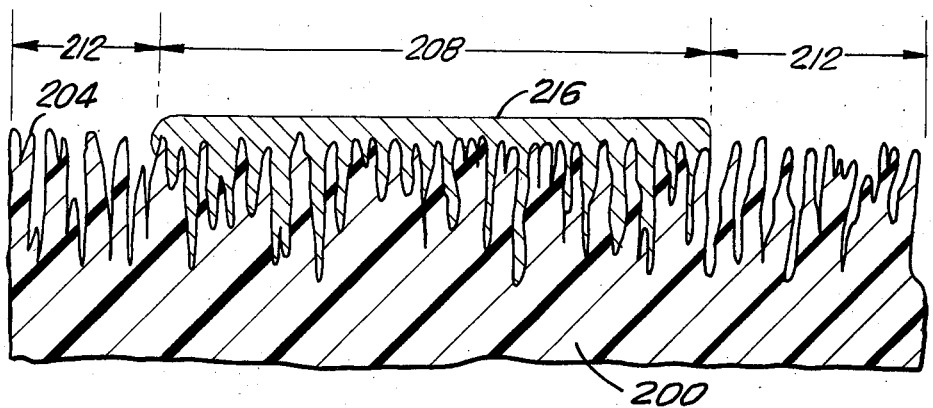
Figure 2G:
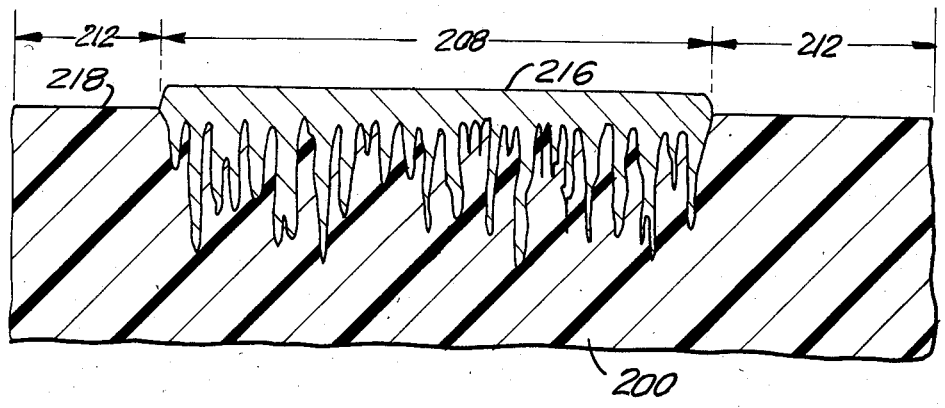
Figure 2H:
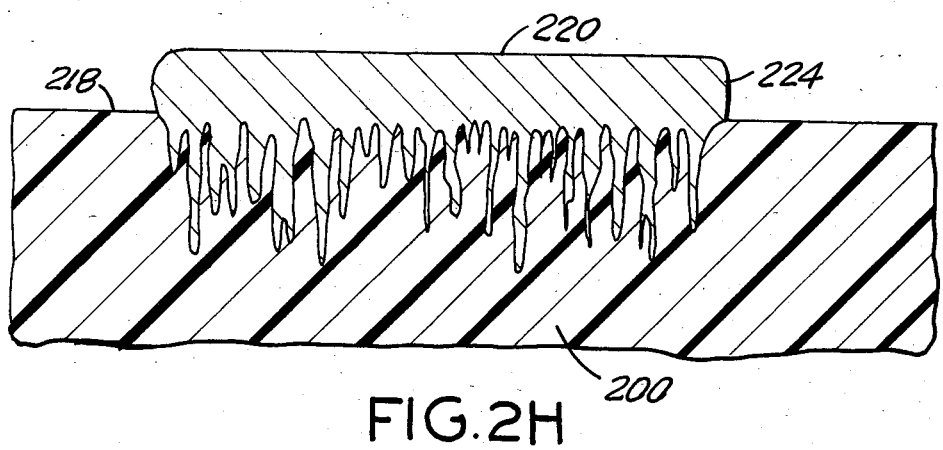
Figure 2I:
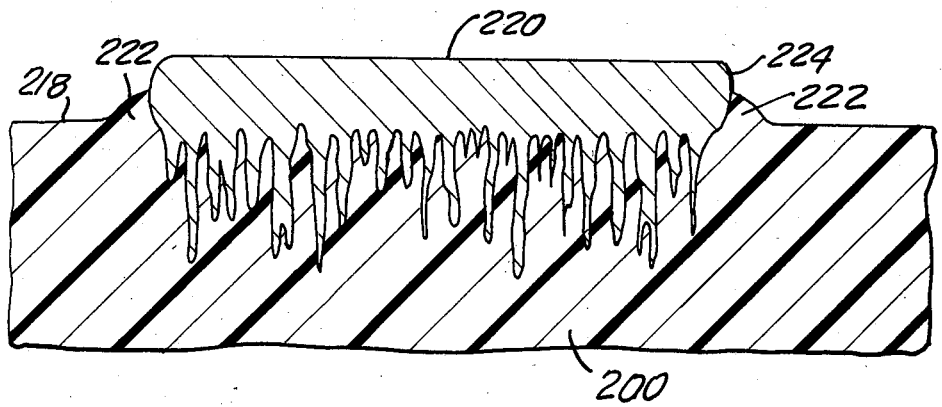

In one aspect, this invention relates to an improvement in a process for preparing a metal pattern on a non-conducting base material which includes the steps of:

treating one or more surfaces of a non-conductive substrate to render them hydrophilic and microporous by adhesion promotion, imaging a pattern corresponding to the desired metal pattern on the surfaces, said pattern being catalytic for electroless metal deposition, the improvement comprising:

after said imaging step, exposing said surfaces to a first electroless metal plating step to initiate metal deposition to reinforce said catalytic pattern;

rendering the non-imaged surfaces of the substrate hydrophobic and resistant to metal deposition on exposure to an electroless metal deposition bath by contacting the substrate with a solvent composition in which the substrate is at least partially soluble for a time period sufficient to solvate the surfaces of the substrate but insufficient to result in stress cracking or flow of the substrate onto the printed circuit, and immediately drying the solvated surfaces of the base material at a temperature at which the solvent rapidly volatilizes to restore the hydrophobicity of the surfaces; and exposing the surfaces to a second electroless metal plating step to deposit metal on the reinforced catalytic pattern to form the metal pattern, the restored hydrophobicity of the non-imaged surface areas inhibiting metal deposition thereon.

In another aspect, this invention relates to an improvement in a process for preparing a metal pattern on a resinous surface of a non-conductive substrate which includes the steps of:

treating one or more surfaces of a non-conductive substrate to render them hydrophilic and microporous by adhesion promotion, imaging a pattern corresponding to the desired metal pattern on the surfaces, said pattern being catalytic for electroless metal deposition, the improvement comprising:

after said imaging step, exposing said surfaces to a first electroless metal plating step to initiate electroless metal plating on the surfaces to reinforce said catalytic pattern;

rendering the non-imaged surfaces of the substrate hydrophobic and resistant to metal deposition on exposure to an electroless metal deposition bath by contacting the substrate with a solvent composition in which the substrate is at least partially soluble for a time period sufficient to solvate the surfaces of the substrate but insufficient to result in stress cracking or flow of the substrate on the metal pattern, and immediately drying the solvated surfaces of the base material at a temperature at which the solvent rapidly volatilizes to restore the hydrophobicity of the surfaces;

exposing the surfaces to a second metal plating step to deposit metal on the reinforced catalytic pattern to form the metal pattern without metal deposition on the restored hydrophobic, non-imaged, surface areas;

after said electroless metal deposition, contacting the surfaces with a solvent in which the resinous surface is at least partially soluble for a time period sufficient to permit the solvated resinous surface to flow against and adhere to the edges of the metal pattern, but insufficient to permit the solvated resinous surface to flow onto the metal pattern; and immediately evaporating the solvent from the resinous surfaces at a temperature at which the solvent rapidly volatilizes to stop said flow, leaving the edges of the metal pattern adhered to the resinous surfaces at their intersection.

In still another aspect, this invention relates to an improvement in a process for preparing a metal pattern on a resinous surface of a non-conductive substrate which includes the steps of:

treating one or more surfaces of a non-conductive substrate to render them hydrophilic and microporous by adhesion promotion, imaging a catalytic pattern corresponding to the desired metal pattern on the surfaces, and depositing metal on the catalytic pattern to form the metal pattern, the improvement comprising:

after said electroless metal deposition, contacting the resinous surfaces with a solvent in which the resinous surfaces are at least partially soluble for a time period sufficient to permit the solvated resinous surfaces to flow against and adhere to the edges of the metal pattern, but insufficient to permit the solvated resinous surfaces to flow onto the metal pattern; and immediately evaporating the solvent from the resinous surfaces at a temperature at which the solvent rapidly volatilizes to stop and flow, leaving the edges of the metal pattern adhered to the resinous surfaces at their intersection.

The aforementioned processes of this invention may be applied advantageously to the manufacture of printed circuits on insulating resinous base materials.

One embodiment of this invention provides a process for treating the surface of a non-conductive substrate such as a polymer base material containing a metal deposit thereon. The surface of the polymer base material has been adhesion promoted by conventional techniques prior to metal deposition, e.g., by chemical treatment with a highly oxidizing solution or with a plasma under conditions sufficient to render the surface hydrophilic. The hydrophilic surface provides sites for chemical and/or mechanical linking to a metal layer.

A metal pattern may be applied to the adhesion promoted surface by conventional techniques, i.e., by imaging a pattern which is catalytic for electroless metal deposition on the surface by conventional photoforming techniques.

According to applicants' process, the imaged pattern then is reinforced by electroless metal deposition until the metal pattern has a thickness between about 0.5 micrometers and about 5 micrometers.

After the initial electroless metal deposit reinforces the imaged pattern, the non-imaged surfaces of the base material are rendered smooth, hydrophobic and resistant to extraneous metal deposition. This may be accomplished by immersing the polymer in a solvent in which the polymer is at least partially soluble and for a time period sufficient to solvate the polymer surface but insufficient to result in stress cracking or flow of the polymer onto the metal pattern. The time period will vary between about 1 second and about 1 minute depending on the solvent system selected and the polymer system being treated. The solvent systems include a strong solvent for the polymer and suitable diluents. Among the diluents are aliphatic hydrocarbons, aliphatic alcohols and water. Immediately after being contacted with the solvent, the polymer surface is dried at a temperature at which the solvent rapidly volatilizes. The drying temperature is from room temperature up to about 200° C. depending upon the polymers and the solvent system used. Preferably, the drying temperature is between about room temperature and about 125° C.

The immersion may be in a liquid solvent such as ketones, esters, aromatic or aprotic solvents, or in solvent vapors of halogenated hydrocarbons with boiling points below the heat distortion temperature of the polymer.

Suitable non-conductive substrates include thermoset polymers such as epoxy resins; a thermoset or thermoplastic resin coated, metal core base material, thermoplastic polymers as defined hereinafter; a thermoset laminate clad with a high temperature thermoplastic polymer; or resin-rich laminates such as glass cloth reinforced epoxy-resin laminates with a significant thickness of non-reinforced surface-layer epoxy resin. Preferred surface layer epoxy resins include diglycidal ethers of biphenol A.

Insulated metal core base materials include steel and aluminum sheets which may have been perforated with a printed circuit hole pattern and are coated with an insulating resinous material. Suitable insulating resinous materials include epoxy resin coating compositions and high temperature thermoplastic polymers as described hereinbelow. Among the useful coating methods are, inter alia, powder coating techniques such as powder spray coating, electrostatic powder coating and fluidized bed powder coating.

Suitable thermoplastic polymers include high temperature thermoplastic polymers such as sulfone polymers, polyetherimides, polyphenylene sulfides and polyetheretherketones and are believed to include low temperature thermoplastic polymers such as platable grades of polyethylene and acrylonitrile-butadiene-styrene (ABS).

Preferred sulfone polymers according to this invention are polysulfone and polyethersulfone.

These high temperature thermoplastic polymers in molded forms or in extruded sheets, rods and/or film forms initially have hydrophobic and translucent or transparent surfaces before treatment to render them hydrophilic and receptive to adherent metal deposition.

Polysulfones are commercially available under the tradename UDEL TM from Union Carbide Corporation, Danbury, Conn.). Also suitable is a polyphenylsulfone (commercially available under the tradename RADEL TM from Union Carbide Corporation, Danbury, Conn.) and polyethersulfone (commercially available from ICI America, Inc. under the tradename VICTREX TM).

In addition to the polysulfone polymers, other suitable aromatic polyether polymers include polyetherimide (commercially available under the trademark ULTEM from General Electric, One Plastics Avenue, Pittsfield, Mass.) and a commercially available polyetheretherketone (sold under the tradename PEEK by ICI America, Inc.).

For purposes of illustration, the process of this invention is described below with one of the suitable substrates, high temperature thermoplastics. As molded or extruded, these high temperature thermoplastics have a glossy, smooth surface which is hydrophobic. To render such surface receptive to deposition of a metal layer or pattern, it is adhesion promoted (hereinafter also referred to as "etched"). The adhesion promotion renders the surface microporous and hydrophilic, and of a milky haze appearance.

Typically, a high temperature, thermoplastic base material is stress relieved by annealing for 8 to 12 hours or by radiation treatment for a few minutes according to the procedure described in U.S. Pat. No. 4,339,303 and 4,424,095 to Frisch et al., the disclosures of which are incorporated herein by reference. Then, holes may be produced therein by drilling, punching or the like. Alternately, the base material may be molded with holes therein. After the holes are produced, the base material is stress relieved once again as described above, pretreated for about 0.5 to 3 minutes in a dimethyl formamide solution, and is etched in a highly oxidizing solution. This changes the surface of the thermoplastic polymer from glossy and hydrophobic to hazy, hydrophilic and microporous, while providing sites for linking of the surface of the thermoplastic polymer to the metal deposits formed thereon. This completes the adhesion promotion step of this process.

The adhesion promoted base material is coated with a radiation-sensitive composition as described by Polichette et al., U.S. Pat. Nos. 3,772,056; 3,772,078; 3,930,963; 3,959,547; 3,993,802, and 3,994,727, the disclosures of which are incorporated herein by reference. The coating is dried over the entire hydrophilic surface of the base material including on the walls of holes.

The insulating base material coated with the dried layer of the radiation sensitive composition is exposed to ultra-violet light through a photographic master to produce a resistless image of metallic nuclei. The unexposed dried layer of radiation-sensitive composition is removed and the image is fixed, preferably by immersion and agitation in alkaline solutions containing chelating and reducing agents, followed by rinsing.

Acid conditioners typically used for etching acrylonitrile-butadiene-styrene substrates also may be used for the high temperature thermoplastics used in this invention. A typical composition of such a conditioner, on a weight basis, is as follows: 60% $H_2SO_4$, 10% $H_3PO_4$ 1% $CrO_3$, and 30% $H_2O$.

Preferred acid conditioner compositions are described in the examples herein and in U.S. Pat. Nos. 4,339,303 and 4,424,095.

Typically, autocatalytic or electroless metal deposition solutions which may be used for depositing electroless metal on the activated polymer surface of the base material comprise an aqueous solution of a water soluble salt of the metal or metals to be deposited, a complexing or sequestering agent for the metal and a reducing agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, nickel, cobalt, silver, gold solutions. Such solutions are well known in the art and are capable of autocatalytically depositing the identified metals without the use of electricity.

Typical of the electroless copper solutions which may be used are those described in U.S. Pat. No. 3,095,309, the description of which is incorporated herein by reference. Conventionally, such solutions comprise a source of cupric ions, e.g., copper sulfate, a reducing agent for cupric ions, e.g., tetrasodium ethylenediamine-tetraacetic acid, a pH adjustor, e.g., sodium hydroxide and stabilizers and ductility promoters.

Typical electroless nickel baths which may be used comprise aqueous solutions of a nickel salt, such as nickel chloride, an active chemical reducing agent for the nickel salt, such as hypophosphite ion, a complexing agent, such as carboxylic acid and salts thereof, and stabilizers. Electroless gold plating baths which may be used are disclosed in U.S. Pat. No. 3,589,916, incorporated herein by reference. They contain an aqueous alkaline solution of a water soluble salt of gold, a borohydride or amine borane reducing agent, a complexing agent for gold and a small, effective stabilizing amount of cyanide compound in an amount between about 5 micrograms and 500 milligrams. The pH of the bath will be between about 10 and 14.

Typical electroless cobalt systems are well known.

A suitable electroless copper deposition bath is as follows:

| | |
|---|---|
| Copper sulfate | 0.04 moles/l |
| N,N,N$^1$,N$^1$-tetakris (2-hydroxypropyl ethylene diamine) | 0.06 moles/l |
| Sodium Cyanide | 30 mg./l |
| Formaldehyde | 0.07 moles/l |
| Sodium 2-mercapto benzothiazole | 0.075 mg/l |
| Potassium sulfide | 0.6 mg/l |
| Nonylphenoxypolyethoxy phosphate surfactant | 0.14 g/l |
| pH at 25° C. | 12.7 |
| Temperature | 58° C. |

This bath preferably is operated at a temperature of about 58° C., and will deposit a coating of ductile electroless copper about 35 microns thick in about 18 hours.

Utilizing the electroless metal baths of the type described, the catalytic image of the conductive pattern may be reinforced by very thin conducting metal films or layers deposited on the imaged surface of the polymer blank. Ordinarily, the metal films superimposed on the surface of the polymer blank by electroless metal deposition will range from about 0.3 micrometers in thickness up to about 5 micrometers thickness or, more preferrably, from about 0.5 to about 2.5 micrometers. After the non-imaged surface of the polymer blank has been restored to a smooth hydrophobic condition, the electroless metal baths may be utilized to deposit thicker metal layers as desired.

Referring to FIG. 1, steps in the preparation of a printed circuit board are illustrated in flow diagram form. Conventional intermediate treatment steps, such as water rinsing, are not shown but their use as needed will be obvious to those skilled in this art.

Starting with Step 1, an unclad base material is cleaned of any surface grime. The base material for illustration, is a high temperature thermoplastic polymer. It is understood that the base material also may be, for example, a resin-rich surface, epoxy glass laminate or a polymeric coated metal core such as a fluidized bed, epoxy coated, steel substrate.

In Step 2, the thermoplastic base material is subjected to an infrared, microwave or convection (oven bake) anneal as described in U.S. Pat. No. 4,424,095 to Frisch et al., incorporated herein by reference.

In Step 3, the surface of the base material is adhesion promoted. For most base materials, the "swell and etch" adhesion promotion procedure is used. The surface of the base material is contacted with a solvent to "swell" the surface and then the solvent treated surface is contacted with an oxidizing solution, such as a chromic acid solution, followed by treatment with a neutralizing solution, such as sodium bisulfite, concluding with a water rinse.

In Step 4, the surface is coated with a photosensitive catalyst. A typical catalyst contains copper salts and an ultraviolet sensitive photoinitiator, anthraquinone disulfonic acid, as described in U.S. Pat. No. 3,994,727 to Polichette et al.

Upon coating, the surface is dried to remove this water carrier and to render the surface tack-free. This procedure, specified at Step 5, may be accomplished using either convection, an infrared/convection combination or microwave ovens (batch or conveyorized).

In Step 6, the surface is selectively exposed, as through a photonegative, to ultraviolet light. Only those areas which are to be subsequently metal plated, e.g., traces and plated-through holes (or slots) for interconnections, are exposed. The frequency necessary for the ultraviolet light will vary with the photosensitive catalyst used. For the 2,6-anthraquinone system taught by Polichette et al. an ultraviolet light having an energy peak (or band) at 326 nm, with band edges encompassing the spectrum up to 365 or 400 nm may be used.

In Step 7, the surface is cleaned to remove any unexposed catalyst, and the catalytic image of the conductor pattern on the surface is fixed, i.e., the metal nuclei partially coalesced.

In Step 8, this catalytic image is enhanced in an electroless metal plating solution. The catalytic image is reinforced, i.e., increased in thickness to a range of 0.5 to 5 micrometers.

Upon rinsing and drying, the base material with the reinforced image is treated in Step 9 to eliminate the microporous, hydrophilic background from acting as a potential nucleating site for extraneous metal plating. In this step, the surface is exposed to a solvent which will solvate the polymeric surface.

The solvent selected will vary depending on the polymeric surface. For high temperature thermoplastics, a dilute solvent solution at room temperature of isopropyl alcohol (IPA) and dimethylformamide (DMF) may be used. The ratio of DMF and IPA will vary depending upon the specific thermoplastic polymer involved. For example, when solvating a polysulfone surface, about 80% DMF may be used. However, in general, the ratio of DMF to IPA will range from 50 to 90% by volume. For epoxy surfaces, such as resin-rich epoxy laminates and epoxy coated metal core substrates, 100% DMF may be used. In certain instances, e.g., polyetherimide surfaces, it may be necessary to heat the DMF/IPA solution to a temperature from about 35° C. to about 65° C. to solvate the surface.

The time period the polymeric surface is exposed to the solvent is critical. Insufficient time will result in partial smoothing of the surface and incomplete restoration of hydrophobicity. Excessive immersion time may result in stress cracking or flow of thermoplastic resin onto the printed circuit pattern. Typically, exposure time periods of from 1 to 10 seconds are adequate to solvate the surface. Exposure time periods over a minute, even with very low concentrations of the strong solvent (DMF), lead to streaking or running of the thermoplastic. In general, an exposure times period below about 30 seconds is preferred, more preferrably below about 20 seconds.

Immediately upon removal of the polymeric substrate from exposure to the solvent, the polymeric surface should be dried. Convection or infrared/convection oven combinations may be employed for drying. Solvating the surface enables the hydrophilic surface region of the thermoplastic base material to flow and become smooth, non-porous and hydrophobic. The application of heat in drying the solvated surface improves the flow. Drying temperatures, after exposure to liquid solvents, are preferably between about 60° C. and about 200° C.

Prolonged delays after discontinuing solvent exposure and before beginning drying will give rise to a light haze or frosting condition which is somewhat conducive to subsequent extraneous metal deposits. Properly treated surfaces will appear smooth and even translucent or transparent in the case of unfilled or unpigmented high temperature thermoplastics which are translucent or transparent prior to adhesion promotion. Similarly, if a high temperature thermoplastic initially contains a pigment, treatment of its adhesion promoted surface will restore its initial color.

An alternative to solvent immersion involves exposing the surface to solvent vapors similar to those used in a vapor degreasing procedure. It has been found that a methylene chloride vapor will totally restore many thermoplastic surfaces to a smooth and hydrophobic condition without the application of additional heat above room temperature. Subsequent oven baking is preferred to ensure total removal of residual solvents, bound water and to relieve stresses. Alternate solvent vapor systems are believed to include trichlorethane, trifluorotrichloroethane and blends thereof with methylene chloride (commercially available as FREON TMC ™ from E.I. DuPont de Nemours & Co., Inc.).

When the polymer surface at this step was examined with a scanning electron microscope at 1000X magnification, it was found that the porous and hydrophilic surface had reverted back to its original smooth and hydrophobic state. The surface did not wet with water which indicated that the hydrophilic surface had been restored to the hydrophobic condition.

After treatment, the partially plated substrates then may be inspected, electrically tested for short or open circuits, and stored for future plating operations.

As shown in Step 10, the enhanced and treated substrates are electrolessly plated with copper or nickel using fully additive plating procedures to build up the metal images to the desired thickness, typically about 35 micrometers. The metal plating is deposited substantially without extraneous metal formation due to the smoothness and hydrophobicity of the background surface.

The finished boards then are dried and baked at Step 11. The baking temperature depends on the substrate polymer composition. Typical baking temperatures are in the range of 60° C. to 200° C.

FIG. 2 illustrates a side view in cross section of a surface region of a polymer base material 200 in various stages of the formation of a metal pattern on a polymeric base material according to a process of this invention. FIG. 2A shows polymer surface 202 which is smooth and hydrophobic before processing. After adhesion promotion, the polymer surface 202 becomes porous and hydrophilic. FIG. 2B depicts the porous and hydrophilic surface 204 after being adhesion promoted. In FIG. 2C, a photosensitive catalyst 206 has been applied to the adhesion promoted surface 204. In FIG. 2D, a metal image pattern on surface area 208 is formed by exposing the imaged surface area 208 to radiant energy. The non-exposed surface area is shown as 212 in FIG. 2D. The photosensitive catalyst 206 is selectively converted to metallic nuclei 210 by radiant energy on the imaged surface area 208, as shown in FIG. 2D. Unconverted catalyst 206 remains in the background areas 212. FIG. 2E shows the polymer surface region 200 after the image 214 is fixed (the metallic nuclei coalesce) and the unconverted catalyst has been removed from the background areas 212. FIG. 2F shows the polymer surface region 200 after the metallic nuclei have been enhanced by a thin layer of electrolessly deposited metal 216. FIG. 2G illustrates restored polymer surface 218 on the background areas 212. FIG. 2H shows the polymer surface region 200 after an electroless metal layer 220 has been deposited thereon to the desired thickness. FIG. 2I shows the polymer surface region 200 after solvation of the exposed surface and drying are repeated to flow polymer surface 218 against edges 224 of metal pattern 220 at their intersection 222, and thereby increase adherence of the metal pattern 220 to the polymer surface region 200.

EXAMPLE I

An insulating base material for a metal core printed circuit is provided by perforating a steel blank with holes corresponding to the required holes for the printed circuit and applying a blue pigmented coating comprising an epoxy resin (diglycidyl ether of bisphenol A) coating to the blank by a powder coating technique. The insulating base material then is adhesion promoted by the following procedure:

A. Adhesion promotion

1. Immerse in a solvent comprising dimethylformamide for 2 minutes.
2. Rinse the base material in water.
3. Immerse in an aqueous solution of 900 grams chromium trioxide per liter at 55° C. for 5 minutes to etch the surface of the base material.
4. Rinse the base material in water.
5. Neutralize and remove the residual chromium compounds by immersing in a first aqueous neutralizer solution of 1.4% hydrogen peroxide and 1.8% sulfuric acid for five minutes.
6. Repeat step 5 in a second neutralizer solution of the same composition.
7. Rinse in water.

The adhesion promotion changed the appearance of the blue epoxy coating from blue to a milky blue or blue white color.

After adhesion promotion, a real image catalytic for electroless metal deposition corresponding to the desired printed circuit pattern is formed on the base material by the procedures of Polichette et al., U.S. Pat. No. 3,994,727, as described below:

B. Image formation

1. Immerse the adhesion promoted base material for five minutes at 50° C. into an aqueous solution of a radiation-sensitive composition according to Polichette et al., U.S. Pat. No. 3,993,802, having the composition:

| | |
|---|---|
| Sorbitol | 220 g/l |
| 2,6-Anthraquinone disulfonic acid disodium salt | 16 g/l |
| Cupric acetate | 8 g/l |
| Cupric bromide | 0.5 g/l |
| Nonylphenoxypolyethoxyethanol | 2.0 g/l |
| Fluoroboric acid to a pH of | 3.75 |

2. Dry the base material at 50° C. for five minutes to obtain a radiation-sensitive coating on the base material.
3. Expose the base material to ultra-violet light through a photographic negative to obtain a copper nuclei image.

4. Immerse and agitate the base material in an aqueous solution at pH 12.5 containing 1.3 m/l formaldehyde and 0.1 m/l ethylenedinitrilotetraacetate for five minutes.

5. Repeat Step 4 in a second solution of the same composition except that it contains 0.13 m/l formaldehyde.

6. Rinse in water.

The image formation procedure produces a dark image of copper nuclei on the surface of the base material. The image is reinforced by electrolessly plating a 2 micrometer thick layer of copper. The copper is plated from an aqueous solution at 52° C. of the following composition:

| | |
|---|---|
| Copper | 0.05 m/l |
| Ethylenediaminetetra-2-propanol | 0.08 m/l |
| Formaldehyde | 0.05 m/l |
| Alkylphenoxyglycidolphosphate ester (Gafac RE 610, commercially available from GAF Corp.) | 0.0009 m/l |
| Sodium cyanide (by specific ion electrode) | 0.0002 m/l |
| Potassium selenocyanate | 0.007 m/l |
| Alkali metal hydroxide to pH at 25° C. | 12.8 m/l |

The surface with the reinforced image is immersed in dimethylformamide for 30 seconds and immediately dried at 125° C. for 15 minutes. This restores the adhesion promoted background to a non-porous, hydrophobic condition and restores the appearance of the epoxy coating to the original blue color. The base material with the reinforced printed circuit pattern is returned to the copper plating solution described above for further deposition of copper to a thickness of 35 micrometers on the printed circuit pattern.

EXAMPLE II An extruded sheet of polysulfone 1.6 mm thick was cut into panels, stress relieved by exposing to microwave radiation for two minutes. It was drilled to produce through holes. The polysulfone panels with holes was cleaned by brushing and stress relieving by microwave radiation. The panel was adhesion promoted as follows:

Adhesion Promotion 1. Immerse in a solution of 90% dimethylformamide and water for one minute.

2. Immerse for one minute in an aqueous 0.4 g/l solution of Gafac RE 610 at 60° C.

3. Immerse for one minute in an aqueous solution of 48% sulfuric acid at 60° C.

4. Etch for two minutes at 60° C. in an aqueous solution containing:

| | |
|---|---|
| chromium trioxide | 400 g/l |
| sulfuric acid | 450 g/l |
| Perfluoroalkylsulfonate (commercially available as FC-98 TM from 3M Corp.) | 0.5 g/l |

5. Rinse in a dragout rinse.

6. Neutralize the residual chromium by immersion for five minutes in a solution of 1.8% sulfuric acid and 1.4% hydrogen peroxide.

7. Repeat step 6 in another neutralizing solution of the same composition.

8. Rinse in water for two minutes.

The polysulfone panel was then imaged with a printed pattern by the procedure of Example I, and the image was reinforced to a thickness of 1 micrometer by the plating solution of Example I.

The background not covered with the metal image was made smooth and hydrophobic by immersing the polysulfone panel in a solution of 80% dimethylformamide and 20% isopropanol for two seconds and immediately drying in an oven at 65° C.

The printed circuit pattern was plated to a copper thickness of 35 micrometers as described in Example I.

After plating, the printed circuit board, thus produced was free of extraneous copper. The panel then was baked at 125° C. for 60 minutes to remove absorbed moisture and relieve stress.

EXAMPLE III

A sheet of insulating base material was extruded using a mineral filled polysulfone resin (commercially available from Union Carbide Corp. as UDEL P-8000 TM) It was cut into panel size and the panel adhesion promoted, imaged with a printed circuit conductor pattern and the image reinforced by the procedure of Example II.

The hydrophobicity and smoothness of the surface was restored by immersing the imaged base material panel in a solution of 72% dimethylformamide and 28% isopropanol, and by immediately passing the panel through a conveyorized drying oven for 30 seconds at a conveyor speed of 3 meters per minute. The conveyor had both infrared heating and hot air convection heating. The maximum surface temperature of the panel in the oven was believed to be about 60° C. Before treatment to restore hydrophobicity and smoothness, the panel had a white opaque appearance. After exiting the oven, it was translucent.

The panel was dipped in 4 molar hydrochloric acid solution to remove the oxide layer on the image, rinsed and electrolessly plated with copper to a thickness of 35 micrometers as in Example I. It was baked for one hour at 65° C. to dry the panel. The bond strength was determined on a copper line 0.75 mm wide.

To improve the bond strength, the panel was again dipped into the 72% dimethylformamide solution and passed through the conveyorized oven to flow the surface of the base material against the edge of the copper conductor. Then the panel was again baked for one hour at 65° C., cooled and the bond strength redetermined on a 0.76 mm wide copper line.

The procedure was repeated on a second panel, except that the panel was extruded from a mixture of 50% of the mineral filled polysulfone resin (UDEL P8000) and 50% of a chopped glass fiber filled polysulfone resin (commercially available from Union Carbide Corp. as UDEL GF-1006 TM), and the dimethylformamide solution was 60% at 40° C.

The procedure was repeated on a third panel except that the panel was extruded from a glass fiber and mineral filled polyethersulfone resin (commercially available from ICI (Americas) Ltd., Wilmington, Del. as VITREX KM-8 TM), and the solvent solution was 55% dimethylformamide. The results are shown in the following table.

| | Bond Strength (kg/mm) | |
|---|---|---|
| Panel Composition | After Copper Plating & Before Solvent Treatment | After Flowing Surface by Solvent Treatment |
| Mineral Filled | 0.14 | 0.19 |

-continued

| Panel Composition | Bond Strength (kg/mm) | |
|---|---|---|
| | After Copper Plating & Before Solvent Treatment | After Flowing Surface by Solvent Treatment |
| Polysulfone | | |
| Glass & Mineral Filled Polysulfone | 0.18 | 0.21 |
| Glass & Mineral Filled Polyethersulfone | 0.11 | 0.13 |

EXAMPLE IV

An injection molded panel of polysulfone with molded in through holes was annealed by microwave radiation and adhesion promoted, imaged and the image reinforced with 0.5 micrometers of electroless copper by the procedures of Example II.

The surface was restored to a smooth and hydrophobic condition by immersion for 10 seconds in a solution of 80% dimethylformamide and 20% isopropanol and the solvent was immediately evaporated from the surface by placing the panel in a convection oven maintained at 120° C.

The panel was plated with an additional layer of electrolessly deposited copper to a total copper thickness of 35 micrometers. The hydrophobic background between the copper conductors was free of extraneous copper deposits.

EXAMPLE V

Example IV was repeated except the surface was restored to a smooth, hydrophobic condition with a three-second dip in vapors of dichloromethane, and the solvent was evaporated in an oven at 65° C. for 10 minutes.

EXAMPLE VI

Example V was repeated except that after copper plating to a thickness of 35 micrometers, to improve the bond strength the panel was again immersed in dichloromethane vapors and dried in the oven at 65° C. for 30 minutes.

EXAMPLE VII

Example II was repeated except that the solvent used was dimethylformamide diluted with 50% water, and the panels were dried with the conveyorized infrared and hot air heated oven of Example III.

EXAMPLE VIII

Example II was repeated except that N-methylpyrolidone is substituted for dimethylformamide.

EXAMPLE IX

Example I is repeated except that dimethylsulfoxide is substituted for dimethylformamide.

EXAMPLE X

Example IV is repeated except that a mixture of dichloromethane and 1,1,2-trichloro-1,2,2-trifluoroethane (commercially available from E.I. DuPont de Nemours Co., Inc. as FREON TMC TM) is substituted for dichloromethane.

EXAMPLE XI

A panel made of a filled polyphenylene sulfide resin (commercially available as RYTON R-4 TM from Phillips Petroleum Corp., Bartlettsville, Okla.) was adhesion promoted by immersion for three minutes at 60° C. in 30% nitric acid, immersion for three minutes in 100% nitric acid, and immersion for one minute in 48% fluoroboric acid.

A printed circuit image was formed on the panel by the procedure of Example II. After the image was reinforced with a copper deposit 2.5 micrometers thick, the surface between the copper conductors was made smooth and hydrophobic by immersing the panel in dimethylformamide for about 15 seconds, and then evaporating the solvent in the conveyor oven of Example II except that the conveyor speed was 1.5 meters/minute and the exit temperature was correspondingly higher, believed to be 80° C.

The panel was further plated to a copper thickness of 35 micrometers, and the immersion in dimethylformamide and drying step repeated to improve the adhesion of the copper conductors to the polyphenylene sulfide surface. Then the panels were baked for one hour at 120° C. The bond strength as measured on a 0.3 mm conductor was only 0.05 kg/. The bond strength improved after five days storage to 0.12 kg/mm.

EXAMPLE XI

In order to provide electromagnetic radiation and radio frequency shielding a molded enclosure comprising a polycarbonate thermoplastic polymer was adhesion promoted according to the procedures of Example II.

Subsequently, the enclosure was processed according to the Image Formation procedures of Example I, Part B, except that no photographic negative was used. Rather, the entire interior of the molded enclosure was exposed to light to form a uniform coating of metallic copper nuclei on all interior surfaces of said enclosure.

After enhancement of the copper nuclei image, the external surface of the enclosure was restored to a smooth, hydrophobic condition with a three-second dip in vapors of dichloromethane in a vapor degreaser. This also restored the appearance of the external surface of the enclosure to its original condition.

The exterior of the enclosure was further plated to a thickness of about 15 micrometers with the metal plating solution of Example I.

What is claimed is:

1. In a process for preparing a metal pattern on a non-conducting substrate which includes the steps of:
    treating one or more surfaces of a non-conductive substrate to render them hydrophilic and microporous by adhesion promotion, imaging a pattern corresponding to the desired metal pattern on the surfaces, said pattern being catalytic for electroless metal deposition, the improvement which comprises:
    after said imaging step, exposing said surfaces to a first electroless metal plating step to initiate metal deposition to reinforce said catalytic pattern;
    rendering the non-image surfaces of the substrate hydrophobic and resistant to metal deposition on exposure to an electroless metal deposition bath by contacting the substrate with a solvent composition comprised of a solvent in which the substrate is at least partially soluble for a time period sufficient to solvate the non-imaged surfaces of the substrate but insufficient to result in stress cracking or flow of the substrate onto the printed circuit pattern area, and immediately drying the solvated surfaces of the base material at a temperature at which the solvent rapidly volatilizes to restore the hydrophobicity of the surfaces; and exposing the surfaces to a second electroless metal plating step to deposit metal on the reinforced catalytic pattern to form the metal pattern, the restored hydrophobicity of the non-image surface areas inhibiting metal deposition thereon.

2. A process as defined in claim 1, wherein said substrate comprises a thermoset polymer.

3. A process as defined in claim 1, wherein said substrate comprises a thermoplastic polymer.

4. A process as defined in claim 3, wherein said thermoplastic polymer is selected from sulfone polymers, polyetherimides and polyphenylene sulfides.

5. A process as defined in claim 4, wherein said sulfone polymer is selected from polysulfone, polyethersulfone, polyarylsulfone and polyphenylsulfone.

6. A process as defined in claim 1, wherein the substrate is comprised of a reinforcing core having an exterior surface comprising a thermoset or thermoplastic polymer or combinations thereof.

7. A process as defined in claim 1, wherein the substrate is contacted by immersing the base material in vapors of a solvent.

8. A process as defined in claim 7, wherein said solvent is a halogenated hydrocarbon with a boiling point below the heat distortion temperature of the polymer surface.

9. A process as defined in claim 7, wherein said substrate is immersed for a time period up to fifteen seconds.

10. A process as defined in claim 7, wherein said solvent is methylene chloride and said substrate is immersed for a time period up to 5 seconds.

11. A process as defined in claim 1, wherein the surfaces are contacted with a liquid solvent composition.

12. A process as defined in claim 11, wherein the liquid solvent composition comprises a solvent in which the surface is at least partially soluble and a diluent.

13. A process as defined in claim 12, wherein the solvent is selected from the group consisting of dimethylformamide, dimethyl sulfoxide, and N-methylpyrrolidine.

14. A process as defined in claim 12, wherein said diluent is selected from the group consisting of water and alcohols.

15. A process as defined in claim 12, wherein said substrate is contacted for a time period between about 1 second and about 1 minute.

16. A process as defined in claim 12, wherein the substrate is a high temperature thermoplastic and said solvent is dimethylformamide in a concentration of about 50% to about 100% by volume and the diluent is isopropyl alcohol.

17. A process as defined in claim 12, wherein said liquid solvent solution is heated to a temperature between about 35° C. and about 65° C.

18. A process as defined in claim 7, wherein said drying step is conducted at a temperature between about room temperature and about 200° C.

19. A process as defined in claim 12, wherein said drying step is conducted at a temperature between about 60° C. and about 200° C.

20. A process as defined in claim 1, wherein said catalytic pattern is reinforced by electrolessly depositing a metal layer to a thickness between about 0.3 and about 5 micrometers on the surfaces.

21. A process as defined in claim 20, wherein said thickness is between about 0.5 and about 2.5 micrometers.

22. In a process for preparing a metal pattern on a resinous surface of a non-conductive substrate which includes the steps of:

treating one or more surfaces of a non-conductive substrate to render them hydrophilic and microporous by adhesion promotion, imaging a pattern corresponding to the desired metal pattern on the surface to from catalytic sites corresponding to said pattern and catalytic for electroless metal deposition, the improvement which comprises:

after said imaging step, exposing said surface to a first electroless metal plating step to initiate electroless metal deposition to reinforce said catalytic pattern;

rendering the non-imaged surfaces of the substrate hydrophobic and resistant to metal deposition on exposure to an electroless metal deposition bath by contacting the substrate with a solvent composition comprised of a solvent in which the substrate is at least partially soluble for a time period sufficient to solvate the surfaces of the substrate but insufficient to result in stress cracking or flow of the substrate on the metal pattern and immediately drying the solvated surfaces of the base material at a temperature at which the solvent rapidly volatilizes to restore the hydrophobicity of the surfaces;

exposing the surfaces to a second electroless metal plating step to deposit metal on the reinforced catalytic pattern to form the metal pattern without metal deposition on the restored, hydrophobic, non-imaged, surface areas;

after said electroless metal deposition, contacting the surfaces with said solvent for a time period sufficient to permit the solvated resinous surfaces to flow against and adhere to the edges of the metal pattern, but insufficient to permit the solvated resinous surfaces to flow onto the metal pattern; and immediately evaporating the solvent from the resinous surfaces at a temperature at which the solvent rapidly volatilizes to stop said flow, leaving the edges of the metal pattern adhered to the resinous surfaces at their intersection.

23. In a process for preparing a metal pattern on a resinous surface of non-conductive substrate which includes the steps of:

treating one or more surfaces of a non-conductive substrate to render them hydrophilic and microporous by adhesion promotion, imaging a catalytic pattern corresponding to the desired metal pattern on the surfaces, and electrolessly depositing metal on the catalytic pattern to form the metal pattern, the improvement which comprises:

after said electroless metal deposition, contacting the resinous surfaces with a solvent composition comprised of a solvent in which the resinous surfaces are at least partially soluble for a time period sufficient to permit the solvated base material to flow against and adhere to the edges of the metal pattern, but insufficient to permit the solvated resinous surfaces to flow onto the metal pattern; and immediately evaporating the solvent from the resinous surfaces at a temperature at which the solvent rapidly volatilizes to stop said flow, leaving the edges of the metal pattern adhered to the resinous surfaces at their intersection.

24. In a process for preparing a printed circuit board which includes the steps of:
  treating an insulating base material panel to render one or more surfaces thereof hydrophilic and microporous by adhesion promotion, imaging a pattern corresponding to the printed circuit conductor pattern on the surfaces, said pattern being catalytic for electroless metal deposition, the improvement which comprises:
  after said imaging step, exposing said panel to a first electroless metal plating step to initiate metal deposition to reinforce said catalytic pattern;
  rendering the non-imaged surfaces of the base material hydrophobic and resistant to metal deposition on exposure to an electroless metal deposition bath by contacting the panel with a solvent composition comprised of a solvent in which the base material is at least partially soluble, for a time period sufficient to solvate the surface of the base material but insufficient to result in stress cracking or flow of the base material on the printed circuit conductors and immediately drying the solvated surface of the base material at a temperature at which the solvent rapidly volatilizes to restore the hydrophobicity of the surface; and
  exposing the panel to a second electroless metal plating step to deposit metal on the reinforced catalytic pattern to form the printed circuit conductors, the restored hydrophobicity of the non-imaged surface areas inhibiting metal deposition thereon.

25. A process as defined in claim 24, wherein said base material is selected from resin rich epoxy laminates, metal cores coated with a resin composition.

26. A process as defined in claim 25, wherein said resin composition is selected from an epoxy resin, sulfone polymer, polyetherimides, and polyphenylene sulfides.

27. A process as defined in claim 24, wherein said base material is selected from sulfone polymers and polyetherimides.

28. A process as defined in claim 27, wherein said sulfone polymer is selected from polysulfone, polyethersulfone, polyarylsulfone and polyphenylsulfone.

29. A process as defined in claim 24, wherein the surfaces are contacted with said solvent by immersing the base material in vapors of the solvent.

30. A process as defined in claim 29, wherein said solvent comprises a halogenated hydrocarbon having a boiling point below 170° C.

31. A process as defined in claim 29, wherein said base material is immersed for a time period up to fifteen seconds.

32. A process as defined in claim 29, wherein base material comprises a high temperature thermoplastic resin, said solvent is methylene chloride and said base material is immersed for a time period up to 5 seconds.

33. A process as defined in claim 24, wherein the surfaces are contacted with a liquid solvent composition.

34. A process as defined in claim 33, wherein the liquid solvent composition comprises a solvent in which the base material is at least partially soluble and a diluent.

35. A process as defined in claim 34, wherein the solvent is selected from the group consisting of dimethylformamide, dimethyl sulfoxide, and N-methylpyrrolidine.

36. A process as defined in claim 34, wherein said diluent is selected from the group consisting of water and alcohols.

37. A process as defined in claim 34, wherein said base material is contacted for a time period between about 1 second and about 1 minute.

38. A process as defined in claim 34, wherein said solvent is dimethylformamide in a concentration of about 50% to about 100% by volume and the diluent is isopropyl alcohol.

39. A process as defined in claim 34, wherein said liquid solvent solution is heated to a temperature between about 35° C. and about 65° C.

40. A process as defined in claim 29, wherein said drying step is conducted at a temperature between about room temperature and about 200° C.

41. A process as defined in claim 34, wherein said drying step is conducted at a temperature between about 60° and about 200° C.

42. A process as defined in claim 24, wherein said catalytic pattern is reinforced by electrolessly depositing a metal layer to a thickness between about 0.3 and about 5 micrometers on the surfaces.

43. A process as defined in claim 42, wherein said thickness is between about 0.5 and about 2.5 micrometers.

44. In a process for preparing a printed circuit board which includes the steps of:
  treating one or more surfaces of an insulating base material panel to render them hydrophilic and microporous by adhesion promotion, imaging a pattern corresponding to the printed circuit conductor pattern on the surfaces, said pattern being catalytic for electroless metal deposition, the improvement which comprises:
  after said imaging step, exposing said panel to a first electroless metal plating step to initiate metal deposition to reinforce said catalytic pattern;
  rendering the non-imaged surfaces of the base material hydrophobic and resistant to metal deposition on exposure to an electroless metal deposition bath by contacting the surfaces with a solvent composition comprised of a solvent in which the base material is at least partially soluble for a time period sufficient to solvate the surfaces of the base material but insufficient to result in stress cracking or flow of the base material on the conductor pattern, and
  immediately drying the solvated surfaces of the base material at a temperature at which the solvent rapidly volatilizes to restore the hydrophobicity of the surfaces;
  exposing the panel to a second electroless metal plating step to deposit metal on the reinforced catalytic pattern to form the printed circuit conductors without metal deposition on the restored hydrophobic, non-imaged surface areas;
  after said electroless metal deposition, contacting the surfaces with said solvent for a time period sufficient to permit the solvated base material to flow against and adhere to the edge of the metal pattern, but insufficient to permit the solvated material to flow onto the metal pattern; and
  immediately evaporating the solvent from the surfaces of the base material at a temperature at which the solvent rapidly volatilizes to stop said flow,